United States Patent
Qian et al.

(10) Patent No.: US 12,484,340 B2
(45) Date of Patent: Nov. 25, 2025

(54) EPITAXIAL STRUCTURE OF SEMICONDUCTOR DEVICE AND MANUFACTURING METHOD THEREOF AND SEMICONDUCTOR DEVICE

(71) Applicant: Dynax Semiconductor Inc., Suzhou (CN)

(72) Inventors: Hongtu Qian, Suzhou (CN); Yi Pei, Suzhou (CN); Hui Zhang, Suzhou (CN)

(73) Assignee: Dynax Semiconductor, Inc., Suzhou (CN)

( * ) Notice: Subject to any disclaimer, the term of this patent is extended or adjusted under 35 U.S.C. 154(b) by 588 days.

(21) Appl. No.: 17/946,774

(22) Filed: Sep. 16, 2022

(65) Prior Publication Data

US 2023/0019524 A1    Jan. 19, 2023

Related U.S. Application Data

(63) Continuation of application No. PCT/CN2021/142523, filed on Dec. 29, 2021.

(30) Foreign Application Priority Data

Dec. 29, 2020   (CN) .......................... 202011593833.5

(51) Int. Cl.
    *H01L 33/12*    (2010.01)
    *H10D 30/01*    (2025.01)
    *H10D 30/47*    (2025.01)
    *H10H 20/815*   (2025.01)

(52) U.S. Cl.
    CPC ........ *H10H 20/815* (2025.01); *H10D 30/015* (2025.01); *H10D 30/47* (2025.01)

(58) Field of Classification Search
    None
    See application file for complete search history.

(56) References Cited

U.S. PATENT DOCUMENTS

| | | | | |
|---|---|---|---|---|
| 2013/0175539 | A1* | 7/2013 | Choi | H10D 30/015 257/190 |
| 2015/0236122 | A1* | 8/2015 | Ren | H10D 30/4755 438/172 |
| 2021/0043736 | A1* | 2/2021 | Yen | H10D 62/127 |
| 2021/0359120 | A1* | 11/2021 | Matsumoto | H10D 84/038 |
| 2022/0199822 | A1* | 6/2022 | Hao | H10D 62/115 |
| 2022/0376084 | A1* | 11/2022 | Hao | H10D 62/115 |

* cited by examiner

*Primary Examiner* — William C Trapanese
(74) *Attorney, Agent, or Firm* — Westbridge IP LLC

(57) ABSTRACT

Disclosed are an epitaxial structure of a semiconductor device, a manufacturing method, and a semiconductor device. The epitaxial structure includes a substrate and a semiconductor layer; the semiconductor layer includes a buffer layer; the buffer layer includes a first buffer subsection and a second buffer subsection which are connected to each other and arranged along a direction from a source preset region to a drain preset region, and a vertical projection on the substrate of the first buffer subsection overlaps with a vertical projection on the substrate of the source preset region, and a vertical projection on the substrate of the second buffer subsection overlaps with a vertical projection on the substrate of each of the gate preset region and the drain preset region; an ion implant concentration in the second buffer subsection is greater than or equal to an ion implant concentration in the first buffer subsection.

18 Claims, 6 Drawing Sheets

EPITAXIAL STRUCTURE OF SEMICONDUCTOR DEVICE AND MANUFACTURING METHOD THEREOF AND SEMICONDUCTOR DEVICE

CROSS-REFERENCE TO RELATED DISCLOSURES

This application is a continuation of International Application No. PCT/CN2021/142523, filed on Dec. 29, 2021, which claims priority to Chinese Patent Application No. 202011593833.5, filed on Dec. 29, 2020. Both applications are incorporated herein by reference in their entireties.

TECHNICAL FIELD

Embodiments of the present application relate to the technical field of semiconductor, and more particularly, relate to an epitaxial structure of a semiconductor device and a manufacturing method thereof, and a semiconductor device.

BACKGROUND

Semiconductor material gallium nitride has become a current research hotspot due to its large band gap, high electron saturation drift velocity, high breakdown electric field strength and good thermal conductivity. For example, it is used to manufacture gallium nitride high electron mobility transistor (GaN HEMT) device.

Reducing electric leakage and improving electro-static discharge (ESD) protection are important directions for GaN HEMT device optimization. In the prior art, doping or ion implant is usually performed in the buffer layer during epitaxial growth to increase a resistivity of the buffer layer, thereby achieving higher breakdown voltage and lower leakage. However, from the viewpoint of improving electrostatic protection, it is necessary to reduce the resistivity of the buffer layer between a gate and a source. However, if the above-mentioned solution for reducing electric leakage is adopted, the entire buffer layer will have a similar higher resistivity. As a result, increasing the resistivity will be in conflict of improving ESD protection.

How to improve the electrostatic protection capability of the semiconductor device while reaching higher breakdown voltage and maintaining lower electric leakage is an urgent problem to be solved.

SUMMARY

Embodiments of the present application provide an epitaxial structure of semiconductor device and a manufacturing method thereof, and a semiconductor device, the semiconductor device including the epitaxial structure has high breakdown voltage, low electric leakage, and high electrostatic protection capability.

A first aspect, an embodiment of the present application provides an epitaxial structure of semiconductor device, and the epitaxial structure includes:

a substrate and a semiconductor layer located on one side of the substrate. the semiconductor layer includes at least a buffer layer disposed on one side of the substrate; the buffer layer includes a first buffer subsection and a second buffer subsection which are connected to each other and arranged along a direction from a source preset region to a drain preset region. The vertical projection (located on the substrate) of the first buffer subsection overlaps with the vertical projection (located on the substrate) of the source preset region, and vertical projection (located on the substrate) of the second buffer subsection overlaps with the vertical projection (located on the substrate) of each one of the gate preset region and the drain preset region. There are ions implanted in the buffer layer, the ion implant concentration in the second buffer subsection is greater than or equal to the ion implant concentration in the first buffer subsection; and the gate preset region is located between the source preset region and the drain preset region.

Optionally, a resistivity of the second buffer subsection is greater than or equal to a resistivity of the first buffer subsection.

Optionally, the ion implant concentration $C_1$ in the first buffer subsection satisfies $C_1=0$; the resistivity $\rho_1$ of the first buffer subsection satisfies $0.1\ \Omega\cdot cm \leq \rho_1 \leq 100\ \Omega\cdot cm$; the ion implant concentration $C_2$ in the second buffer subsection satisfies $1\times10^{17}\ cm^{-3} \leq C_2 \leq 5\times10^{18}\ cm^{-3}$; and the resistivity $\rho_2$ of the second buffer subsection satisfies $10^5\ \Omega\cdot cm \leq \rho_2 \leq 10^{10}\ \Omega\cdot cm$.

Optionally, the ion implant concentration $C_1$ in the first buffer subsection satisfies $0<C_1\leq 5\times10^{18}\ cm^{-3}$; the resistivity $\rho_1$ of the first buffer subsection satisfies $0.1\ \Omega\cdot cm \leq \rho_1 \leq 10^{10}\ \Omega\cdot cm$; the ion implant concentration $C_2$ in the second buffer subsection satisfies $1\times10^{17}\ cm^{-3} \leq C_2 \leq 5\times10^{18}\ cm^{-3}$; and the resistivity $\rho_2$ of the second buffer subsection satisfies $10^5\ \Omega\cdot cm \leq \rho_2 \leq 10^{10}\ \Omega\cdot cm$.

Optionally, the semiconductor layer further includes a blocking layer, the blocking layer is located on one side of the buffer layer away from the substrate, and the band gap of the blocking layer is greater than the band gap of the buffer layer.

The blocking layer includes a first blocking subsection and a second blocking subsection which are connected to each other and arranged along a direction from the source preset region to the drain preset region, a vertical projection (located on the substrate) of the first blocking subsection overlaps with a vertical projection (located on the substrate) of the source preset region, and a vertical projection (located on the substrate) of the second blocking subsection overlaps with a vertical projection (located on the substrate) of each one of the gate preset region and the drain preset region.

There are ions implanted in the blocking layer, an ion implant concentration in the second blocking subsection is greater than or equal to an ion implant concentration in the first blocking subsection.

Optionally, the ion implant concentration in the second blocking subsection is less than the ion implant concentration in the second buffer subsection.

Optionally, a resistivity of the second blocking subsection is greater than or equal to a resistivity of the first blocking subsection.

Optionally, the ion implant concentration $C_3$ in the first blocking subsection satisfies $C_3=0$, the resistivity $\rho_3$ of the first blocking subsection satisfies $0.1\ \Omega\cdot cm \leq \rho_3 \leq 100\ \Omega\cdot cm$, the ion implant concentration $C_4$ in the second blocking subsection satisfies $1\times10^{15}\ cm^{-3} \leq C_4 \leq 5\times10^{16}\ cm^{-3}$; and the resistivity $\rho_4$ of the second blocking subsection satisfies $10^5\ \Omega\cdot cm \leq \rho_4 \leq 10^{10}\ \Omega\cdot cm$.

Optionally, the ion implant concentration $C_3$ in the first blocking subsection satisfies $0<C_3\leq 5\times10^{16}\ cm^3$, the resistivity $\rho_3$ of the first blocking subsection satisfies $0.1\ \Omega\cdot cm \leq \rho_3 \leq 10^{10}\ \Omega\cdot cm$, the ion implant concentration $C_4$ in the second blocking subsection satisfies $1\times10^{15}$ cm$^{-3}$≤C$_4$≤5×10$^{16}$ cm$^{-3}$, and the resistivity ρ$_4$ of the second blocking subsection satisfies 10$^5$ Ω·cm≤ρ$_4$≤10$^{10}$ Ω·cm.

Optionally, the semiconductor layer further includes a nucleation layer located between the substrate and the buffer layer. The nucleation layer includes a first nucleation subsection and a second nucleation subsection, the first nucleation subsection and the second nucleation subsection are connected to each other, and arranged along a direction from the source preset region to the drain preset region. The first nucleation subsection is located between the first buffer subsection and the substrate, and the second nucleation subsection is located between the second buffer subsection and the substrate. There are ions implanted in the nucleation layer, and the ion implant concentration in the second nucleation subsection is greater than or equal to the ion implant concentration in the first nucleation subsection.

Optionally, a resistivity of the second nucleation subsection is greater than or equal to a resistivity of the first nucleation subsection.

Optionally, the ion implant concentration C$_5$ in the first nucleation subsection satisfies C$_5$=0, the resistivity ρ$_5$ of the first nucleation subsection satisfies 0.1 Ω·cm≤ρ$_5$≤100 Ω·cm, an ion concentration C$_6$ in the second nucleation subsection satisfies 1×10$^{17}$ cm$^{-3}$≤C$_6$≤5×10$^{18}$ cm$^{-3}$, and the resistivity ρ$_6$ of the second nucleation subsection satisfies 10$^5$ Ω·cm≤ρ$_6$≤10$^{10}$ Ω·cm.

Optionally, the ion implant concentration C$_5$ in the first nucleation subsection satisfies 0<C$_5$≤5×10$^{18}$ cm$^3$, the resistivity ρ$_5$ of the first nucleation subsection satisfies 0.1 Ω·cm≤ρ$_5$≤10$^{10}$ Ω·cm, the ion concentration C$_6$ in the second nucleation subsection satisfies 1×10$^{17}$ cm$^{-3}$≤C$_6$5×10$^{18}$ cm$^{-3}$, and the resistivity ρ$_6$ of the second nucleation subsection satisfies 10$^5$ Ω·cm≤ρ$_6$≤10$^{10}$ Ω·cm.

Optionally, the ions include at least one of boron ions, arsenic ions, helium ions, beryllium ions, magnesium ions, argon ions, aluminum ions, phosphorus ions, nitrogen ions, oxygen ions, carbon ions and iron ions.

A second aspect, an embodiment of the present application further provides a manufacturing method of an epitaxial structure of a semiconductor device, the manufacturing method is used to manufacture the epitaxial structure provided by the first aspect, and the manufacturing method includes:

providing a substrate; and forming a semiconductor layer at one side of the substrate; where the semiconductor layer at least includes a buffer layer disposed on one side of the substrate; the buffer layer includes a first buffer subsection and a second buffer subsection which are connected to each other and arranged along a direction from a source preset region to a drain preset region, a vertical projection of the first buffer subsection on the substrate overlaps with a vertical projection of the source preset region on the substrate, and a vertical projection of the second buffer subsection on the substrate overlaps with a vertical projection of each one of the gate preset region and the drain preset region on the substrate; there are ions implanted in the buffer layer, an ion implant concentration in the second buffer subsection is greater than or equal to an ion implant concentration in the first buffer subsection; and the gate preset region is located between the source preset region and the drain preset region.

Optionally, the semiconductor layer further includes a blocking layer. A band gap of the blocking layer is greater than a band gap of the buffer layer; and the blocking layer includes a first blocking subsection and a second blocking subsection. The first blocking subsection and the second blocking subsection are connected to each other, and arranged along a direction from the source preset region to the drain preset region. The first blocking subsection is located on one side of the first buffer subsection away from the substrate, and the second blocking subsection is located on one side of the second buffer subsection away from the substrate.

The forming a semiconductor layer at one side of the substrate includes:

forming the buffer layer and the blocking layer at one side of the substrate sequentially; and implanting the ions into the blocking layer and the buffer layer from one side of the blocking layer away from the substrate, where an ion implant concentration in the second blocking subsection is greater than or equal to an ion implant concentration in the first blocking subsection, and an ion implant concentration in the second blocking subsection is less than an ion implant concentration in the second buffer subsection.

Optionally, the semiconductor layer further includes a nucleation layer. The nucleation layer includes a first nucleation subsection and a second nucleation subsection which are connected to each other and arranged along a direction from the source preset region to the drain preset region, the first nucleation subsection is located between the first buffer subsection and the substrate, and the second nucleation subsection is located between the second buffer subsection and the substrate.

The forming a semiconductor layer at one side of the substrate includes:

forming the nucleation layer and the buffer layer at one side of the substrate sequentially; and implanting ions into the buffer layer and the nucleation layer from one side of the buffer layer away from the substrate, where an ion implant concentration in the second nucleation subsection is greater than or equal to an ion implant concentration in the first nucleation subsection.

A third aspect, an embodiment of the present application further provides a semiconductor device, the semiconductor device includes the epitaxial structure provided by the first aspect.

The semiconductor device further includes a gate, a source and a drain, both of the gate, the source and the drain are located on one side of the semiconductor layer away from the substrate, the gate is disposed in the gate preset region, the source is disposed in the source preset region, and the drain is disposed in the drain preset region.

In the epitaxial structure of the semiconductor device provided by the embodiment of the present application, the ion implant concentration of different regions in the buffer layer is different. Due to high ion implant concentration of the buffer layer (that is, the second buffer subsection) between the gate preset region and the drain preset region, the resistivity of the second buffer subsection may be increased. Thus, the breakdown voltage of the semiconductor device may be increased and the electric leakage of the semiconductor device may be reduced in a case where the epitaxial structure is applied to the semiconductor device; and due to low ion concentration (even zero) of the buffer layer (that is, the first buffer subsection) between the gate preset region and the source preset region, the first buffer subsection may maintain a low resistivity. Thus, the electrostatic protection capability of the semiconductor device may be improved in a case where the epitaxial structure is applied to a semiconductor device. As a result the semiconductor device using the epitaxial structure would achieve high breakdown voltage, low electric leakage, and high electrostatic protection capability.

DETAILED DESCRIPTION OF THE EMBODIMENTS

The present application will be further described in detail below with reference to the accompanying drawings and embodiments. It should be understood that the specific embodiments described herein are only used to explain the present application, but not to limit the present application. In addition, it should be noted that, for the convenience of description, the accompanying drawings only show some but not all structures related to the present application.

Figure 1:
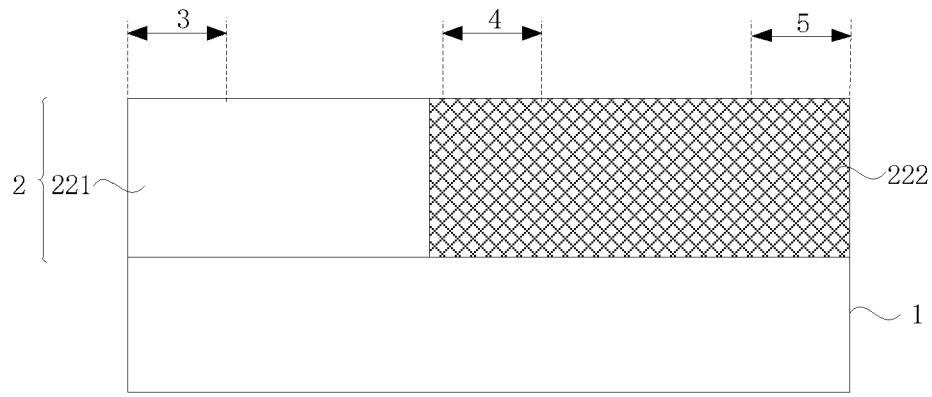
FIG. 1 is a schematic structural diagram of an epitaxial structure of a semiconductor device according to an embodiment of the present application.

FIG. 1 is a schematic structural diagram of an epitaxial structure of a semiconductor device according to an embodiment of the present application. As shown in FIG. 1, an epitaxial structure 10 of a semiconductor device provided by the embodiment of the present application includes a substrate 1 and a semiconductor layer 2 located on one side of the substrate 1. The semiconductor layer 2 at least includes a buffer layer 22 disposed on one side of the substrate 1, and the buffer layer 22 includes a first buffer subsection 221 and a second buffer subsection 222, the first buffer subsection 221 and a second buffer subsection 222 are connected to each other and arranged along a direction from a source preset region 3 to a drain preset region 5. The vertical projection of the first buffer subsection 221 on the substrate 1 overlaps with a vertical projection of the source preset region 3 on the substrate 1, and the vertical projection of the second buffer subsection 222 on the substrate 1 is overlaps with the vertical projection of each of the gate preset region 4 and the drain preset region 5 on the substrate. There are ions implanted in the buffer layer 22, the ion implant concentration in the second buffer subsection 222 is greater than the ion implant concentration in the first buffer subsection 221, and the gate preset region 4 is located between the source preset region 3 and the drain preset regions 5.

The epitaxial structure 10 provided by the embodiment of the present application is applied to manufacturing a semiconductor device. Specifically, a heterojunction structure is formed by secondary growth on the epitaxial structure 10, and both of a gate, a source and a gate are formed on one side of the heterojunction structure away from the substrate, so that the manufacture of semiconductor device is completed. The source is disposed in the above-mentioned source preset region 3, the gate is disposed in the above-mentioned gate preset region 4, and the drain is disposed in the above-mentioned drain preset region 5.

For semiconductor device, the highest voltage is experienced between the gate and the drain. Therefore, a high resistivity region needs to be formed in the semiconductor layer between the gate and the drain, and a low resistivity needs to be maintained in the semiconductor layer between the gate and the source, in order to obtain a better electrostatic protection capability. Therefore, in order to achieve high breakdown voltage, low electric leakage, and high electrostatic protection capability in the semiconductor device, the embodiment of the present application provides an epitaxial structure, by performing ion implant on the buffer layer 22 in different regions, so that the buffer layers 22 in different regions have different resistivity. Furthermore, the semiconductor device using the epitaxial structure has high breakdown voltage, low electric leakage and high electrostatic protection capability.

Specifically, since the ion implant concentration in the second buffer subsection 222 is greater than the ion implant concentration in the first buffer subsection 221, a resistivity of the second buffer subsection 222 is greater than the resistivity of the first buffer subsection 221. The first buffer subsection 221 corresponds to a region between the gate preset region 4 and the source preset region 3, so that it can meet a requirement that a high electrostatic protection capability requires a low resistivity between the gate preset region 4 and the source preset region 3; and the second buffer subsection 222 corresponds to a region between the gate preset region 4 and the drain preset region 5, so that it can meet a requirement that both high breakdown voltage and low electric leakage require a high resistivity.

Exemplarily, a boundary line between the first buffer subsection 221 and the second buffer subsection 222 may be located at a preset distance from the gate preset region 4 to the source preset region 3. Exemplarily, the distance between the boundary line and the gate preset region 4 may be 0 nm~100 nm.

It should be noted that, a low-concentration ion implantation may be performed in the first buffer subsection 221, or an ion implantation may not be performed, as long as the electrostatic protection capability of the semiconductor device is not affected.

It should also be noted that, in a same film layer in FIG. 1 and subsequent drawings, the filled portion indicates that ion implantation is performed, and the unfilled portion indicates that ion implantation is not performed.

Optionally, a material of the substrate 1 may be one or a combination of gallium nitride, aluminum gallium nitride, indium gallium nitride, aluminum indium gallium nitride, indium phosphide, gallium arsenide, silicon carbide, diamond, sapphire, germanium, silicon, or material of the substrate 1 may be any other material that is capable of growing group-III nitrides.

In the epitaxial structure of the semiconductor device provided by the embodiment of the present application, the ion implant concentration of different regions in the buffer layer is different. Due to high ion implant concentration of the buffer layer (that is, the second buffer subsection) between the gate preset region and the drain preset region, the resistivity of the second buffer subsection may be increased. Thus, the breakdown voltage of the semiconductor device may be increased and the electric leakage of the semiconductor device may be reduced in a case where the epitaxial structure is applied to a semiconductor device; and due to low ion concentration (which could be even zero) of the buffer layer (that is, the first buffer subsection) between the gate preset region and the source preset region, the first buffer subsection may maintain a low resistivity. Thus, the electrostatic protection capability of the semiconductor device may be improved in a case where the epitaxial structure is applied to the semiconductor device. As a result, the semiconductor device would achieve high breakdown voltage, low electric leakage, and high electrostatic protection capability.

On the basis of the embodiments above, the structure of the epitaxial structure will be further described in detail below.

Optionally, the ion implant concentration $C_1$ in the first buffer subsection 221 satisfies $C_1=0$, the resistivity $\rho_1$ of the first buffer subsection 221 satisfies $0.1\ \Omega\cdot cm \leq \rho_1 \leq 100\ \Omega\cdot cm$, the ion implant concentration $C_2$ in the second buffer subsection 222 satisfies $1\times10^{17}\ cm^{-3} \leq C_2 \leq 5\times10^{18}\ cm^{-3}$, and the resistivity $\rho_2$ of the second buffer subsection 222 satisfies $10^5\ \Omega\cdot cm \leq \rho_2 \leq 10^{10}\ \Omega\cdot cm$.

In this embodiment, an ion implantation is not performed in the first buffer subsection 221, so that the first buffer subsection 221 may maintain an original low resistivity and thus have better electrostatic protection capability. Ion implantation is performed in the second buffer subsection 222, thereby the second buffer subsection 222 has higher resistivity, and it could achieve high breakdown voltage and low electric leakage of semiconductor device.

Optionally, an ion implant concentration $C_1$ in the first buffer subsection 221 is less than or equal to an ion implant concentration $C_2$ in the second buffer subsection 222. Specifically, the ion implant concentration $C_1$ in the first buffer subsection 221 satisfies $0<C_1\leq 5\times10^{18}\ cm^3$, the resistivity $\rho_1$ of the first buffer subsection 221 satisfies $0.1\ \Omega\cdot cm \leq \rho_1 \leq 10^{10}\ \Omega\cdot cm$, the ion implant concentration $C_2$ in the second buffer subsection 222 satisfies $1\times10^{17}\ cm^{-3} \leq C_2 \leq 5\times10^{18}\ cm^{-3}$, and the resistivity $\rho_2$ of the second buffer subsection 222 satisfies $10^5\ \Omega\cdot cm \leq \rho_2 \leq 10^{10}\ \Omega\cdot cm$.

In this embodiment, an ion implant is performed in both of the first buffer subsection 221 and the second buffer subsection 222, and the ion implant concentration $C_1$ in the first buffer subsection 221 is less than or equal to the ion implant concentration $C_2$ in the second buffer subsection 222, thus the resistivity of the first buffer subsection 221 may be less than or equal to the resistivity of the second buffer subsection 222, and this will achieve high breakdown voltage and low electric leakage in semiconductor device.

Figure 2:
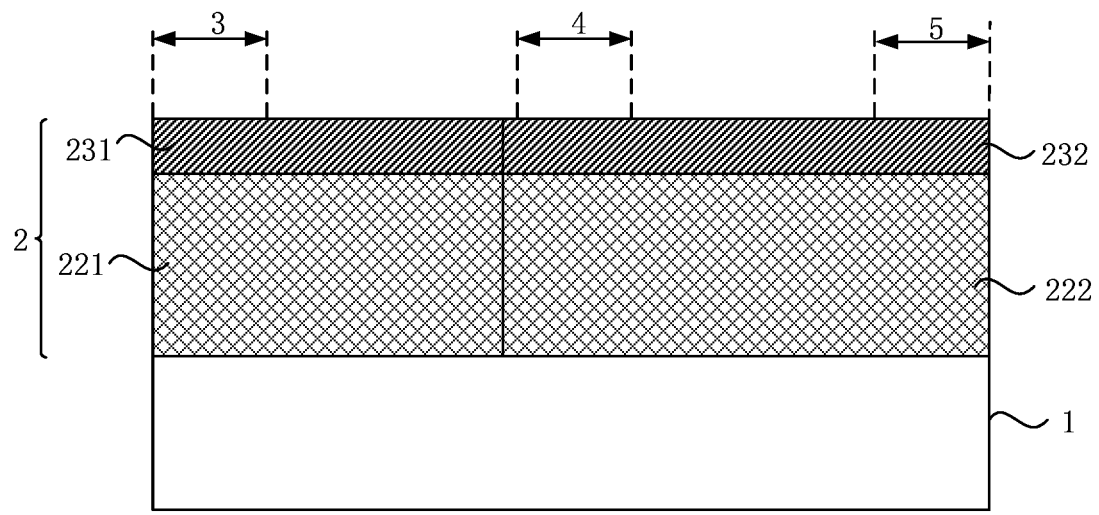
FIG. 2 is a schematic structural diagram of another epitaxial structure of a semiconductor device according to an embodiment of the present application.

FIG. 2 is a schematic structural diagram of another epitaxial structure of a semiconductor device according to an embodiment of the present application. As shown in FIG. 2, an epitaxial structure 10 of the semiconductor device includes a substrate 1 and a semiconductor layer 2 on one side of the substrate 1. The semiconductor layer 2 includes at least a buffer layer 22 and a blocking layer 23 stacked on one side of the substrate 1. A band gap of the blocking layer 23 is greater than the band gap of the buffer layer 22, and there are ions implanted at least in the buffer layer 22 and the blocking layer 23, and the ion implant concentration in the blocking layer 23 is less than the ion implant concentration in the buffer layer 22.

In this embodiment, the ion implant concentration in the second buffer subsection 222 is equal to the ion implant concentration in the first buffer subsection 221.

Optionally, the resistivity $\rho_1$ of the first buffer subsection 221 and the resistivity $\rho_2$ of the second buffer subsection 222 satisfy $0.1\ \Omega\cdot cm \leq \rho_1=\rho_2 \leq 10^{10}\ \Omega\cdot cm$, and the ion implant concentration $C_1$ in the first buffer subsection 221 and the ion implant concentration $C_2$ in the second buffer subsection 222 satisfy $1\times10^{17}\ cm^{-3} \leq C_1=C_2 \leq 5\times10^{18}\ cm^{-3}$.

Further optionally, the material of the blocking layer 23 includes $Al_xGa_{(1-x)}N$, where $0.8\leq x \leq 1$. The ion implant concentration $C_3$ in a first blocking subsection 231 and the ion implant concentration in a second blocking subsection 232 satisfy $1\times10^{15}\ cm^{-3} \leq C_3=C_4 \leq 5\times10^{16}\ cm^{-3}$, and the resistivity $\rho_3$ of the first blocking subsection 231 and the resistivity $\rho_4$ of the second blocking subsection 232 satisfy $10^5\ \Omega\cdot cm \leq \rho_3=\rho_4 \leq 10^{10}\ \Omega\cdot cm$.

In this embodiment, the composition of Al (aluminum) in the blocking layer 23 is higher than that in the buffer layer 22, so that the band gap of the blocking layer 23 is greater than the band gap of the buffer layer 22, thereby the buffer layer 22 may obtain the above-mentioned sufficiently high resistivity with the above-mentioned lower ion implant concentration. Thus, the electric leakage of the semiconductor device may be reduced and the electron mobility may be satisfied in a case where the epitaxial structure is applied to a semiconductor device.

Figure 3:
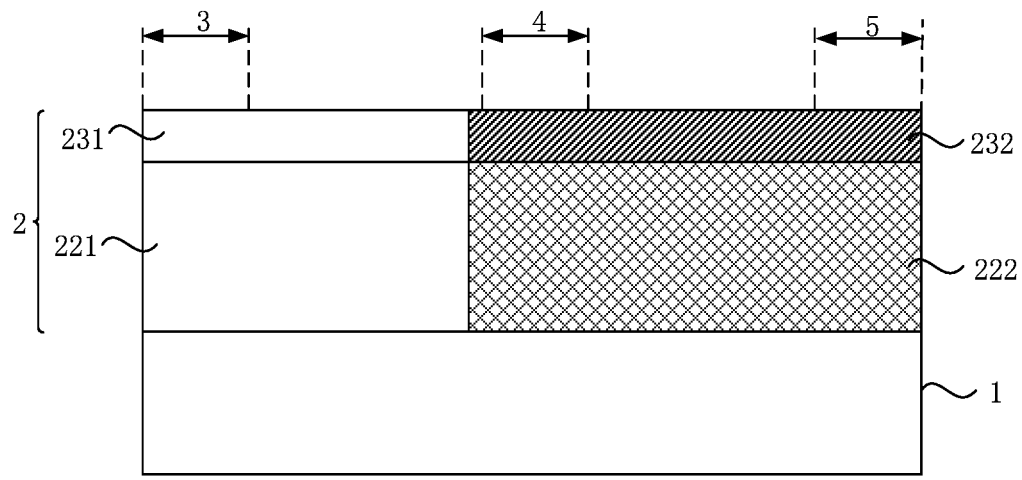
FIG. 3 is a schematic structural diagram of another epitaxial structure of a semiconductor device according to an embodiment of the present application.

FIG. 3 is a schematic structural diagram of another epitaxial structure of a semiconductor device according to an embodiment of the present application. As shown in FIG. 3, optionally, the semiconductor layer 2 further includes a blocking layer 23, the blocking layer 23 is located on one side of the buffer layer 22 away from the substrate 1, and the band gap of the blocking layer 23 is greater than the band gap of the buffer layer 22. The blocking layer 23 includes the first blocking subsection 231 and the second blocking subsection 232, the first blocking subsection 231 and the second blocking subsection 232 are connected to each other and arranged along a direction from the source preset region 3 to the drain preset region 5. The first blocking subsection 231 is located on one side of the first buffer subsection 221 away from the substrate 1, and the second blocking subsection 232 is located on one side of the second buffer subsection 222 away from the substrate 1. There are ions implanted in the blocking layer 23, and the ion implant concentration in the second blocking subsection 232 is greater than the ion implant concentration in the first blocking subsection 231, and the ion implant concentration in the second blocking subsection 232 is less than the ion implant concentration in the second buffer subsection 222.

As shown in FIG. 3, in this embodiment, in different regions of the barrier layer 23, ion implantation is performed on the barrier layer 23 in the same manner, so that the electrostatic protection capability of the semiconductor device can be improved while achieving high breakdown voltage and low electric leakage in a case where the epitaxial structure is applied to a semiconductor device. Please refer to the above description for the specific reason, which will not be repeated here. In addition, the blocking layer 23 disposed in this embodiment may also ensure the mobility of the two-dimensional electron gas.

Specifically, a heterojunction structure in a semiconductor device usually includes a channel layer and a barrier layer, the barrier layer is located on one side of the channel layer away from the epitaxial structure, and a two-dimensional electron gas (2DEG) is formed on one side of the channel layer close to the barrier layer, the channel layer provides a channel for the two-dimensional electron gas (2DEG) movement. Usually, the channel layer consists electric leakage. Since the ions cannot be implanted into the channel layer, in order to reduce the electric leakage of the channel layer, it is usually necessary to reduce the thickness of the channel layer. If the epitaxial structure shown in FIG. 1 is adopted for manufacturing the semiconductor device, reducing the thickness of the channel layer will cause the buffer layer 22 to be closer to the two-dimensional electron gas. Due to the high ion implant concentration in the second buffer subsection 222, the high ions concentration will reduce the electron mobility in the two-dimensional electron gas, and the performance of the semiconductor device will be adversely affected.

An embodiment of the present application provides another epitaxial structure to avoid above problem. By adding the blocking layer 23 on the buffer layer 22, the barrier layer will be isolated from the buffer layer. Meanwhile, compared with the buffer layer 22, due to a larger band gap of the blocking layer 23, the blocking layer 23 (the second blocking subsection 232) may obtain a sufficiently high resistivity by only implanting lower concentration (dose) of ions when the ion implantation is performing. As a result, the reduction of the electron mobility in the two-dimensional electron gas can be avoided while achieving the above-mentioned beneficial effects.

In addition, since the ions implanted in the buffer layer 22 are usually in a ionized state, by disposing the blocking layer 23, the two-dimensional electron gas can be isolated from the buffer layer 22, and the ions in the buffer layer 22 can also be prevented from entering the channel layer when the heterojunction structure is sequentially grown on the epitaxial structure 10.

Furthermore, in this embodiment, the ion implant concentration in the second blocking subsection 232 is lower than the ion implant concentration in the second buffer subsection 222, which has little impact on the mobility of the two-dimensional electron gas. Therefore, the thickness of the channel layer may be further reduced to reduce the electric leakage of the channel layer when the epitaxial structure provided by the embodiment of the present application is used to manufacture the semiconductor device.

Further optionally, the material of the buffer layer 22 includes $Al_xGa_{(1-x)}N$ or $In_xGa_{(1-x)}N$, and $0 \leq x \leq 0.5$. The material of the blocking layer 23 includes $Al_xGa_{(1-x)}N$, and $0.8 \leq x \leq 1$. According to the value of x, the buffer layer 22 may be GaN or AlGaN or InGaN. The resistivity of the buffer layer 22 is generally small, so higher ion implant concentration is needed to increase the resistivity of the buffer layer 22.

Further optionally, the ion implant concentration $C_3$ in the first blocking subsection 231 satisfies $C_3=0$. The resistivity $\rho_3$ of the first blocking subsection 231 satisfies $0.1 \ \Omega\cdot cm \leq \rho_3 \leq 100 \ \Omega\cdot cm$. The ion implant concentration $C_4$ in the second blocking subsection 232 satisfies $1 \times 10^{15}$ $cm^{-3} \leq C_4 \leq 5 \times 10^{16} \ cm^{-3}$. The resistivity $\rho_4$ of the second blocking subsection 232 satisfies $10^5 \ \Omega\cdot cm \leq \rho_4 \leq 10^{10} \ \Omega\cdot cm$.

Further optionally, the ion implant concentration $C_3$ in the first blocking subsection 231 satisfies $0 < C_3 \leq 5 \times 10^{16} \ cm^{-3}$. The resistivity $\rho_3$ of the first blocking subsection 231 satisfies $0.1 \ \Omega\cdot cm \leq \rho_3 \leq 10^{10} \ \Omega\cdot cm$.

The ion implant concentration $C_4$ in the second blocking subsection 232 satisfies $1 \times 10^{15} \ cm^{-3} \leq C_4 \leq 5 \times 10^{16} \ cm^{-3}$. The resistivity $\rho_4$ of the second blocking subsection 232 satisfies $10^5 \ \Omega\cdot cm \leq \rho_4 \leq 10^{10} \ \Omega\cdot cm$.

In this embodiment, the composition of Al (aluminum) in the blocking layer 23 is higher than that in the buffer layer 22, so that the band gap of the blocking layer 23 is greater than the band gap of the buffer layer 22, thereby the buffer layer 22 may obtain the above-mentioned sufficient high resistivity using only the above-mentioned ion implantation with a lower concentration. Thus, the electron mobility may be guaranteed in a case where the epitaxial structure is applied to a semiconductor device.

In addition, in this embodiment, the ion implantation is not performed in the first blocking subsection 231, or the ion implant concentration of the first blocking subsection 231 is lower than the ion implant concentration of the second blocking subsection 232, so that the first blocking subsection 231 may maintain its original low resistivity. Thus, the electrostatic protection capability of a semiconductor device may be better in a case where the epitaxial structure is applied to the semiconductor device. The ion implantation is performed in the second blocking subsection 232 to acquire high resistivity, thus the semiconductor device may have high breakdown voltage and low electric leakage in a case where the epitaxial structure is applied to the semiconductor device.

Figure 4:
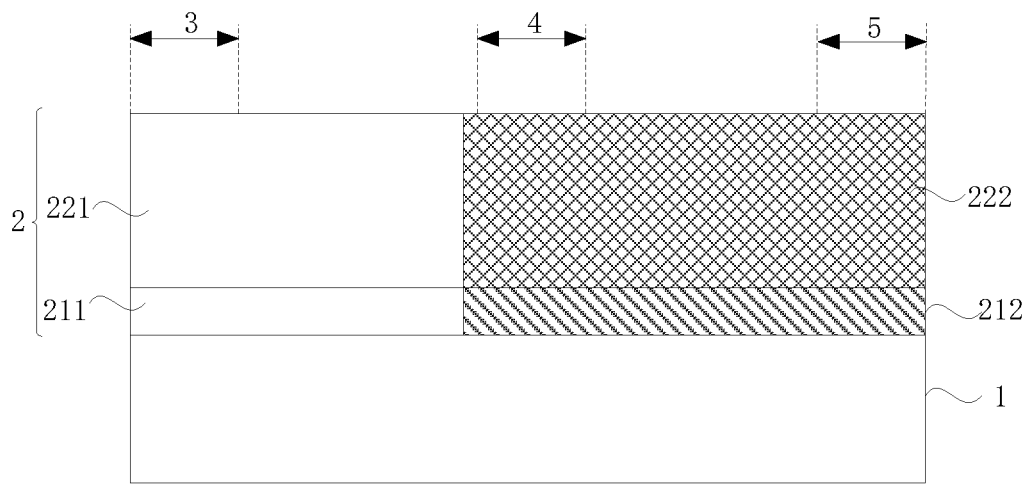
FIG. 4 is a schematic structural diagram of another epitaxial structure of a semiconductor device according to an embodiment of the present application.

FIG. 4 is a schematic structural diagram of another epitaxial structure of a semiconductor device according to an embodiment of the present application. As shown in FIG. 4, optionally, the semiconductor layer 2 further includes a nucleation layer 21, and the nucleation layer 21 is located between the substrate 1 and the buffer layer 22; the nucleation layer 21 includes a first nucleation subsection 211 and a second nucleation subsection 212 which are connected to each other, the first nucleation subsection 211 and a second nucleation subsection 212 are arranged along a direction from the source preset region 3 to the drain preset region 5. The first nucleation subsection 211 is located between the first buffer subsection 221 and the substrate 1, and the second nucleation subsection 212 is located between the second buffer subsection 222 and the substrate 1; there are ions implanted in the nucleation layer 21, and the ion implant concentration in the second nucleation subsection 212 is greater than the ion implant concentration in the first nucleation subsection 211.

By disposing the nucleation layer 21, crystal lattices of the substrate 1 and the buffer layer 22 may be matched, so that parameters such as crystal quality, surface morphology and electrical properties of the heterojunction above the epitaxial structure may be optimized in a case where the epitaxial structure is applied to the semiconductor device. It should be noted that, since the electric leakage of the nucleation layer 21 is generally small, the ion implantation may or may not be performed in the nucleation layer 21, which is not limited in the embodiment of the present application.

In this embodiment, the electric leakage of the nucleation layer 21 may be further reduced by performing ion implantation into the nucleation layer 21 in different regions. Thus, the semiconductor device may have a high breakdown voltage, and meanwhile the electrostatic protection capability of the semiconductor device may also be improved in a case where the epitaxial structure is applied to the semiconductor device. Please refer to the above description for the specific reasons, which will not be repeated here.

Further optionally, the material of the nucleation layer 21 includes $Al_xGa_{(1-x)}N$, and $0.5 \le x \le 1$. The ion implant concentration $C_5$ in the first nucleation subsection 211 satisfies $C_5=0$. The resistivity $\rho_5$ of the first nucleation subsection 211 satisfies $0.1\ \Omega\cdot cm \le \rho_5 \le 100\ \Omega\cdot cm$. An ion concentration $C_6$ in the second nucleation subsection 212 satisfies $1\times10^{17}\ cm^{-3} \le C_6 \le 5\times10^{18}\ cm^{-3}$. The resistivity $\rho_6$ of the second nucleation subsection 212 satisfies $10^5\ \Omega\cdot cm \le \rho_6 \le 10^{10}\ \Omega\cdot cm$.

Further optionally, the ion implant concentration $C_5$ in the first nucleation subsection 211 satisfies $0 < C_5 \le 5\times10^{18}\ cm^{-3}$. The resistivity $\rho_5$ of the first nucleation subsection 211 satisfies $0.1\ \Omega\cdot cm \le \rho_5 \le 10^{10}\ \Omega\cdot cm$. The ion concentration $C_6$ in the second nucleation subsection 212 satisfies $1\times10^{17}\ cm^{-3} \le C_6 5\times10^{18}\ cm^{-3}$. The resistivity $\rho_6$ of the second nucleation subsection 212 satisfies $10^5\ \Omega\cdot cm \le \rho_6 \le 10^{10}\ \Omega\cdot cm$.

In this embodiment, ion implantation is not performed in the first nucleation subsection 211, or the ion implant concentration of the first nucleation subsection 211 is less than the ion implant concentration of the second nucleation subsection 212, so that the first nucleation subsection 211 may maintain the original low resistivity and has better electrostatic protection capability. The ion implantation is performed in the second nucleation subsection 212, so that it has high resistivity, and thus high breakdown voltage and low electric leakage of semiconductor device may be achieved.

To sum up, the epitaxial structure is further described in the above-mentioned embodiments, for which the following points need to be stated.

First, in other embodiments, the semiconductor layer may also include a nucleation layer, a buffer layer, and a blocking layer, and the ion implantation is performed in the nucleation layer, the buffer layer, and the blocking layer (and the substrate) in different regions, which is not limited in the embodiment of the present application.

Figure 5:
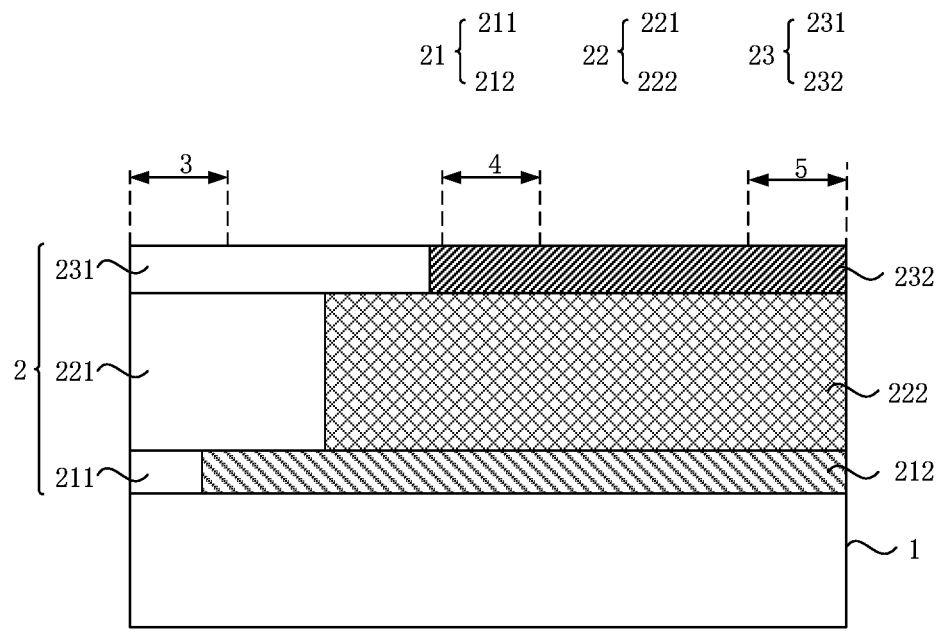
FIG. 5 is a schematic structural diagram of another epitaxial structure of a semiconductor device according to an embodiment of the present application.

Second, in the above-mentioned embodiments, an example is shown here with the boundary lines of each film layer are consistent. When the ion implantation is performed in two or more film layers in the semiconductor layer in different regions, the ion implantation process is simpler and more efficient. In addition, exemplary, FIG. 5 is a schematic structural diagram of another epitaxial structure of a semiconductor device according to an embodiment of the present application. As shown in FIG. 5, FIG. 5 illustrates a semiconductor layer including a nucleation layer, a buffer layer, and a blocking layer stacked on one side of a substrate. Optionally, the boundary line between the first nucleation subsection 211 and the second nucleation subsection 212, the boundary line between the first buffer subsection 221 and the second buffer subsection 222, and the boundary line between the first blocking subsection 231 and the second blocking subsection 232 may be inconsistent, as long as it is ensured that the semiconductor layer on one side of the epitaxial structure farthest from the substrate, such as the blocking layer in FIG. 3 or FIG. 5 and the buffer layer in FIG. 4, satisfy that the boundary line of ion implantation regions with different concentrations is closer the gate preset area 4. Optionally, the ions include at least one of boron ions, arsenic ions, helium ions, beryllium ions, magnesium ions, argon ions, aluminum ions, phosphorus ions, nitrogen ions, oxygen ions, carbon ions, and iron ions.

By implanting at least one of the above ions into the buffer layer 22 (as well as the blocking layer 23, the nucleation layer 21, and the substrate 1), the resistivity of the corresponding film layer may be increased, thereby the electric leakage of the semiconductor device may be reduced.

Further optionally, the types of ions implanted in the blocking layer 23, the buffer layer 22 and the nucleation layer 21 are the same, and this solution may reduce the difficulty of preparation and improve production efficiency.

Based on the same inventive concept, an embodiment of the present application further provides a manufacturing method of an epitaxial structure of a semiconductor device, the manufacturing method is used to manufacture the epitaxial structure provided by any of the above embodiments.

Figure 6:
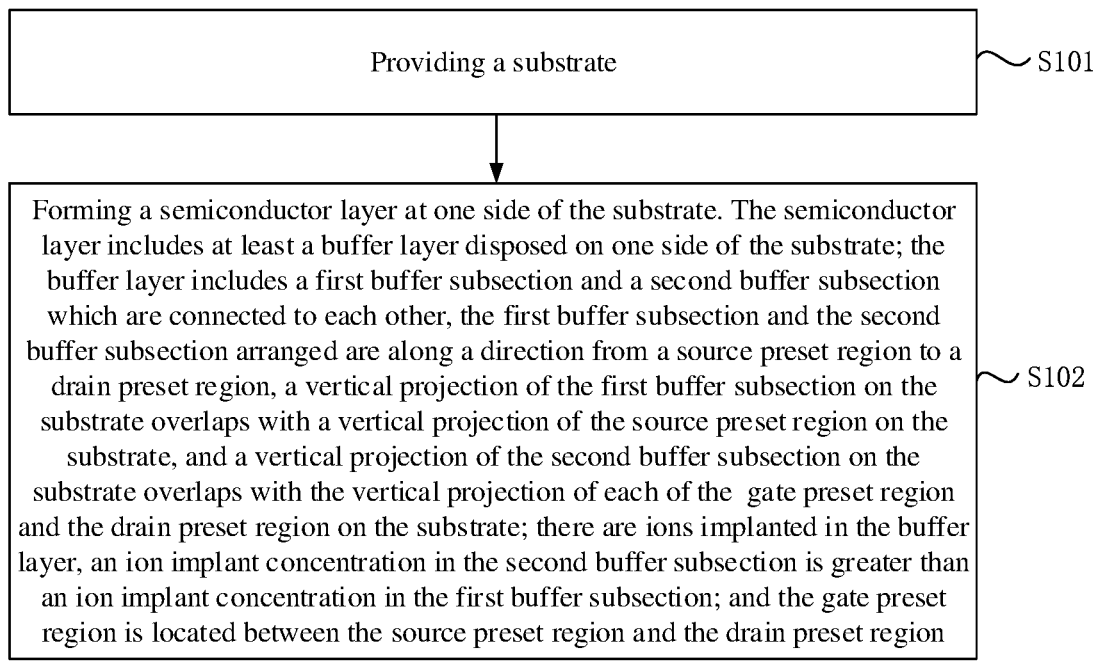
FIG. 6 is a schematic flow chart of a manufacturing method of an epitaxial structure of a semiconductor device according to an embodiment of the present application.

FIG. 6 is a schematic flow chart of a manufacturing method of an epitaxial structure of a semiconductor device according to an embodiment of the present application. Referring to FIG. 6, the manufacturing method includes the following steps S101 and S102.

S101: providing a substrate.

S102: forming a semiconductor layer at one side of the substrate. The semiconductor layer includes at least a buffer layer disposed on one side of the substrate; the buffer layer includes a first buffer subsection and a second buffer subsection which are connected to each other, the first buffer subsection and the second buffer subsection arranged are along a direction from a source preset region to a drain preset region, a vertical projection of the first buffer subsection on the substrate overlaps with a vertical projection of the source preset region on the substrate, and a vertical projection of the second buffer subsection on the substrate overlaps with the vertical projection of each of the gate preset region and the drain preset region on the substrate; there are ions implanted in the buffer layer, an ion implant concentration in the second buffer subsection is greater than an ion implant concentration in the first buffer subsection; and the gate preset region is located between the source preset region and the drain preset region.

In the manufacturing method provided by the embodiment of the present application, by performing ion implantation in the buffer layer in different regions, and performing high-concentration ion implantation in the buffer layer (ie, the second buffer subsection) between the gate preset region and the drain preset region, the resistivity of the second buffer subsection may be increased, and thus, the breakdown voltage of the semiconductor device may be increased, and the electric leakage of the semiconductor device may be reduced in a case where the epitaxial structure is applied to the semiconductor device. By performing low-concentration ion implantation or no ion implantation in the buffer layer (ie, the first buffer subsection) between the gate preset region and the drain preset region, the first buffer subsection may maintain a low resistivity, thus, the electrostatic protection capability of the semiconductor device may be improved in a case where the epitaxial structure is applied to a semiconductor device, so that the semiconductor device can achieve high breakdown voltage, low electric leakage, and high electrostatic protection capability when using the epitaxial structure.

On this basis, the manufacturing method of the epitaxial structure will be further described in detail below with reference to the specific structure of the epitaxial structure. Please refer to the above description for parameters such as materials and ion implant concentrations of each film layer in the epitaxial structure, which will not be repeated here.

As shown in FIG. 3, the semiconductor layer 2 further includes the blocking layer 23, and a band gap of the blocking layer 23 is larger than the band gap of the buffer layer 22. The blocking layer 23 includes a first blocking subsection 231 and a second blocking subsection 232 which are connected to each other, the first blocking subsection 231 and the second blocking subsection 232 are arranged along a direction from the source preset region 3 to the drain preset region 5. The first blocking subsection 231 is located on one side of the first buffer subsection 221 away from the substrate 1, and the second blocking subsection 232 is located on one side of the second buffer subsection 222 away from the substrate 1. The epitaxial structure may be manufactured with reference to the manufacturing method shown in FIG. 7.

Figure 7:
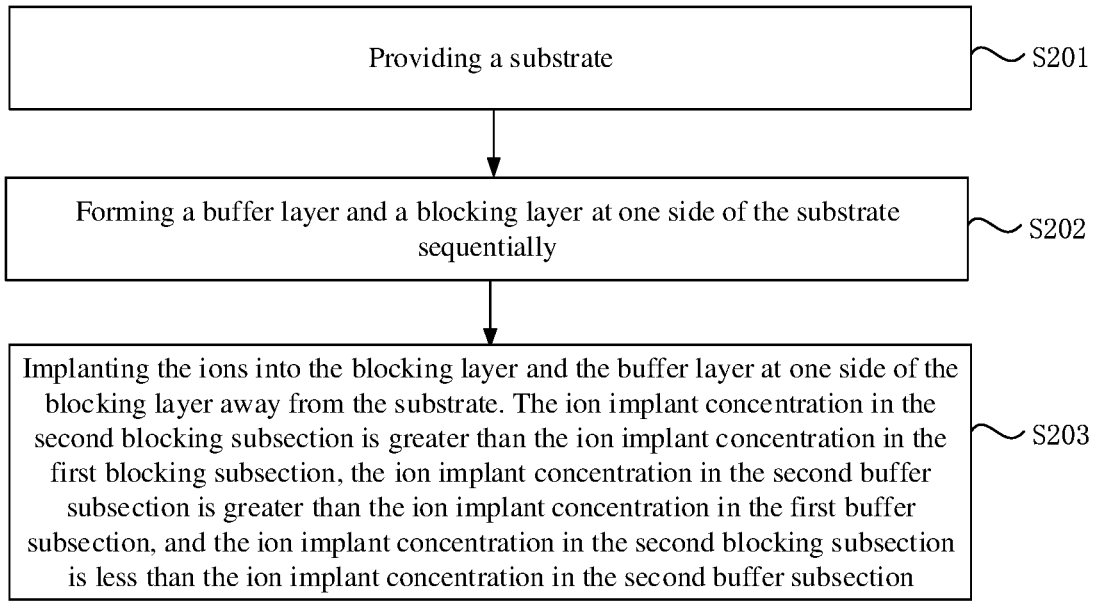
FIG. 7 is a schematic flow chart of a manufacturing method of an epitaxial structure of another semiconductor device according to an embodiment of the present application.

FIG. 7 is a schematic flow chart of a manufacturing method of an epitaxial structure of another semiconductor device according to an embodiment of the present application. Referring to FIG. 7, the manufacturing method includes the following steps S201~S203.

S201: providing a substrate.

S202: forming a buffer layer and a blocking layer at one side of the substrate sequentially.

S203: implanting the ions into the blocking layer and the buffer layer at one side of the blocking layer away from the substrate. The ion implant concentration in the second blocking subsection is greater than the ion implant concentration in the first blocking subsection, the ion implant concentration in the second buffer subsection is greater than the ion implant concentration in the first buffer subsection, and the ion implant concentration in the second blocking subsection is less than the ion implant concentration in the second buffer subsection.

It should be noted that this embodiment illustrates that the ion implantation of the blocking layer and the buffer layer are completed in the same process. In other embodiments, the buffer layer may also be formed first, and ions are implanted into the buffer layer, and then the blocking layer may be formed, and ions are implanted into the blocking layer, which can be set up by those skilled in the art.

In the manufacturing method provided in this embodiment, a blocking layer is formed on one side of the buffer layer away from the substrate, and ion implantation is performed in the blocking layer in different regions. Thus, in a case where the epitaxial structure is applied to a semiconductor device, the semiconductor device may have high breakdown voltage, low electric leakage, and high electrostatic protection ability. Meanwhile, the electron mobility in the two-dimensional electron gas would not be affected.

As shown in FIG. 2, the semiconductor layer 2 further includes the blocking layer 23, and a band gap of the blocking layer 23 is larger than a band gap of the buffer layer 22. The blocking layer 23 includes a first blocking subsection 231 and a second blocking subsection 232 which are connected to each other, and the first blocking subsection 231 and the second blocking subsection 232 are arranged along a direction from the source preset region 3 to the drain preset region 5. The first blocking subsection 231 is located on one side of the first buffer subsection 221 away from the substrate 1, and the second blocking subsection 232 is located on one side of the second buffer subsection 222 away from the substrate 1. The ion implant concentration in the second blocking subsection 232 is equal to the ion implant concentration in the first blocking subsection 231, the ion implant concentration in the second buffer subsection 222 is equal to the ion implant concentration in the first buffer subsection 221, and the ion implant concentration in the second blocking subsection 232 is less than the ion implant concentration in the second buffer subsection 222. In this way, the only difference from the manufacturing method in the previous embodiment is that: the ion implant concentration in the second blocking subsection 232 is controlled to be equal to or close to equal to the ion implant concentration in the first blocking subsection 231, and the ion implant concentration in the second buffer subsection 231 is controlled to be equal to or close to equal to the ion implant concentration in the first buffer subsection 221, and the ion implant concentration in the second blocking subsection 232 is controlled to be less than the ion implant concentration in the second buffer subsection 222.

As shown in FIG. 4, the semiconductor layer 2 further includes a nucleation layer 21, the nucleation layer 21 includes a first nucleation subsection 211 and a second nucleation subsection 212 which are connected to each other, and the first nucleation subsection 211 and the second nucleation subsection 212 are arranged along a direction from the source preset region 3 to the drain preset region 5. The first nucleation subsection 211 is located between the first buffer subsection 221 and the substrate 1, and the second nucleation subsection 212 is located between the second buffer subsection 222 and the substrate 1. The epitaxial structure may be manufactured with reference to the manufacturing method shown in FIG. 8.

Figure 8:
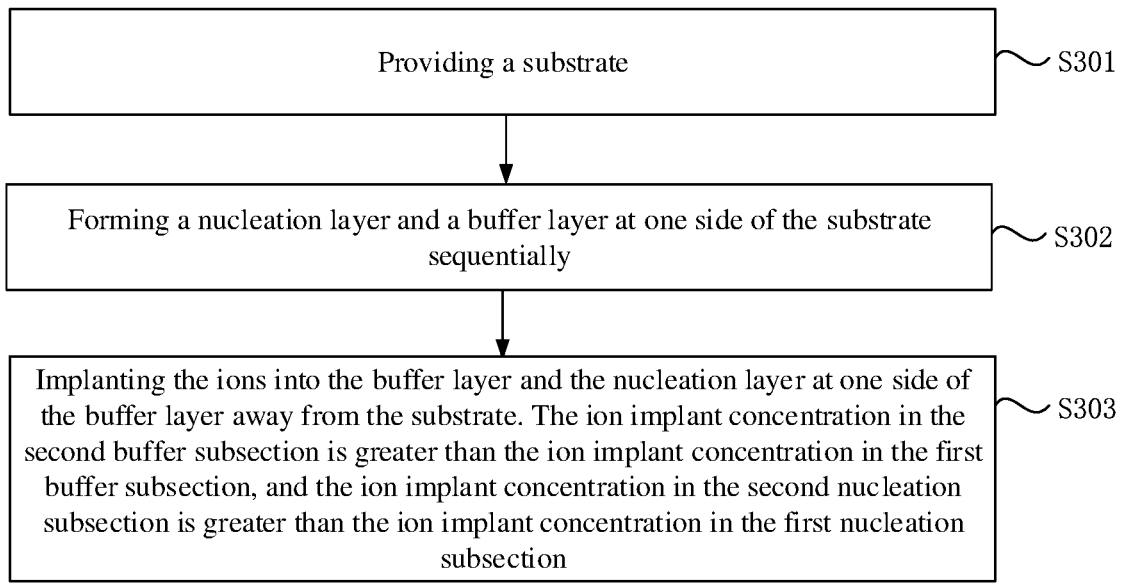
FIG. 8 is a schematic flow chart of a manufacturing method of an epitaxial structure of another semiconductor device according to an embodiment of the present application.

FIG. 8 is a schematic flow chart of a manufacturing method of an epitaxial structure of another semiconductor device according to an embodiment of the present application. Referring to FIG. 8, the manufacturing method includes the following steps S301-S303.

S301: providing a substrate.

S302: forming a nucleation layer and a buffer layer at one side of the substrate sequentially.

S303: implanting the ions into the buffer layer and the nucleation layer at one side of the buffer layer away from the substrate. The ion implant concentration in the second buffer subsection is greater than the ion implant concentration in the first buffer subsection, and the ion implant concentration in the second nucleation subsection is greater than the ion implant concentration in the first nucleation subsection.

It should be noted that the methodology of this embodiment carries out the ion implantation of each of the buffer layer and the nucleation layer in the same process. In other embodiments, the ion implantation of the buffer layer and the nucleation layer can also be completed separately, which is not limited in the embodiments of the present application.

Figure 9:
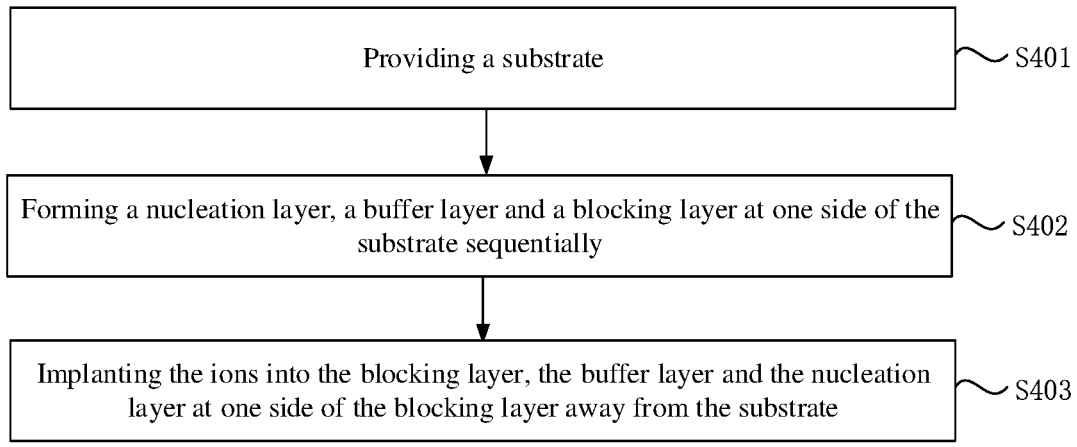
FIG. 9 is a schematic flow chart of a manufacturing method of an epitaxial structure of another semiconductor device according to an embodiment of the present application.

As shown is FIG. 5, the semiconductor layer further includes the nucleation layer 21, there are ions implanted in the nucleation layer 21. The epitaxial structure may be obtained by using the manufacturing method shown in FIG. 9. Referring to FIG. 9, the manufacturing method includes the following steps S401-S403.

S401: providing a substrate.

S402: forming a nucleation layer, a buffer layer and a blocking layer at one side of the substrate sequentially.

S403: implanting the ions into the blocking layer, the buffer layer and the nucleation layer at one side of the blocking layer away from the substrate.

It should be noted that this embodiment illustrates that the ion implantation of the blocking layer, the buffer layer, and the nucleation layer is completed in the same process. In other embodiments, the ion implantation of the nucleation layer, the buffer layer, and the blocking layer may also be completed in sequence with reference to the manufacturing method shown in FIG. 9, which is not limited in the embodiments of the present application.

Figure 10:
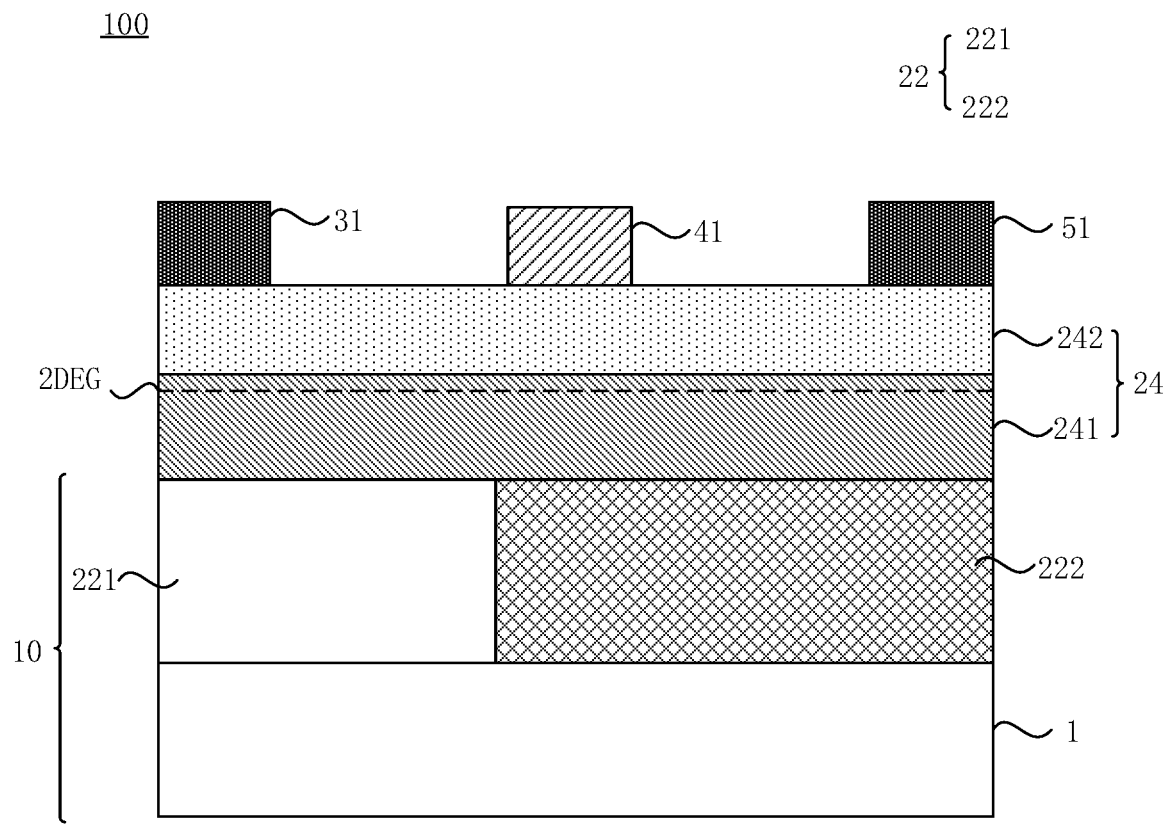
FIG. 10 is a schematic structural diagram of a semiconductor device according to an embodiment of the present application.
Figure 11:
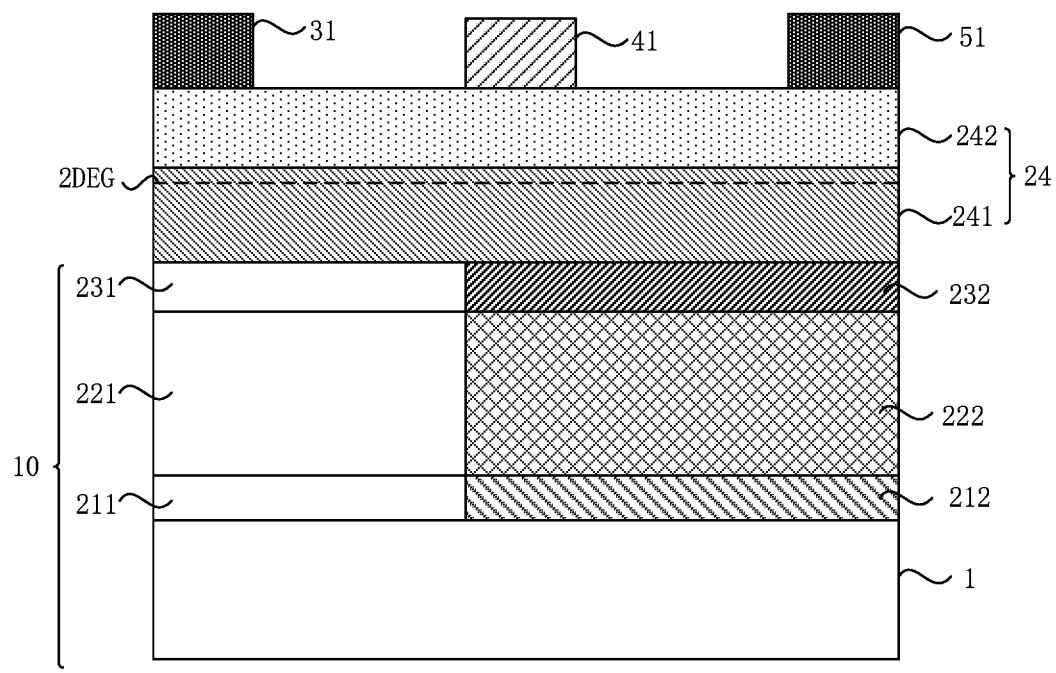
FIG. 11 is a schematic structural diagram of another semiconductor device according to an embodiment of the present application.

Based on the same invention concept, an embodiment of the present application further provides a semiconductor device. FIG. 10 is a schematic structural diagram of a semiconductor device according to an embodiment of the present application, and FIG. 11 is a schematic structural diagram of another semiconductor device according to an embodiment of the present application. Referring to FIG. 10 or FIG. 11, a semiconductor device 100 includes the epitaxial structure 10 provided in the above-mentioned embodiments. The semiconductor device 100 further includes a heterojunction structure 24 located on one side of the epitaxial structure 10 away from the substrate 1, and includes a gate 41, a source 31, and a drain 51 located on one side of the heterojunction structure 24 away from the substrate 1. The gate 41 is disposed in a gate preset region, the source 31 is disposed in the source preset region, and the drain 51 is disposed in the drain preset region.

Referring to FIG. 10, the heterojunction structure 24 includes a channel layer 241 and a barrier layer 242, the barrier layer 242 is located on one side of the channel layer 241 away from the epitaxial structure 10, and a two-dimensional electron gas (2DEG) is formed on one side of the channel layer 241 facing the barrier layer 242.

Optionally, each of the source 31 and the drain 51 forms ohmic contact with the heterojunction structure 24, and the gate 41 and the heterojunction structure 24 forms Schottky Contact. Optionally, the material of the source 31 and the drain 51 may be one or a combination of metals such as Ni, Ti, Al, Au, etc., and the material of the gate 41 may be one or a combination of metals such as Ni, Pt, Pb, Au, etc.

It should be understood that the embodiments of the present application improve the reliability of the semiconductor device from the perspective of the design of the epitaxial structure of the semiconductor device. The semiconductor device includes but are not limited to: high-power gallium nitride high electron mobility transistor (HEMT) operating in a high voltage and high current environment, transistor based on silicon-on-insulator (SOI), gallium arsenide (GaAs)-based transistor, and metal-oxide-semiconductor field-effect transistor (MOSFET), metal-insulation semiconductor field-effect transistor (MISFET), double heterojunction field-effect transistor (DHFET), junction field-effect transistor (JFET), metal semiconductor field effect transistor (MESFET), metal-insulation semiconductor heterojunction field effect transistor (MISHFET) or other field effect transistors.

It should be noted that the above are the only preferred embodiments of the present application and practical technical principles. Those skilled in the art will understand that the present application is not limited to the specific embodiments described herein, and various obvious changes, readjustments and substitutions can be made by those skilled in the art without departing from the protection scope of the present application. Therefore, although the present application has been described in detail through the above embodiments, the present application is not limited to the above embodiments, and can also include more other equivalent embodiments without departing from the concept of the present application, and the scope of the present application is determined by the scope of the attached claims.

What is claimed is:

1. An epitaxial structure of a semiconductor device, comprising:
a substrate; and
a semiconductor layer located on one side of the substrate, wherein the semiconductor layer at least comprises a buffer layer and a blocking layer disposed on one side of the substrate;
the buffer layer comprises a first buffer subsection and a second buffer subsection which are connected to each other and arranged along a direction from a source preset region to a drain preset region;
a vertical projection, on the substrate, of the first buffer subsection overlaps with a vertical projection, on the substrate, of the source preset region, and a vertical projection, on the substrate, of the second buffer subsection overlaps with a vertical projection, on the substrate, of a gate preset region and the drain preset region;
there are ions implanted in the buffer layer, an ion implant concentration in the second buffer subsection is greater than or equal to an ion implant concentration implant in the first buffer subsection;
the gate preset region is located between the source preset region and the drain preset region;
the blocking layer is located on one side of the buffer layer away from the substrate, and a band gap of the blocking layer is greater than a band gap of the buffer layer;
the blocking layer comprises a first blocking subsection and a second blocking subsection which are connected to each other and arranged along a direction from the source preset region to the drain preset region, and the vertical projection, on the substrate, of the first blocking subsection overlaps with the vertical projection, on the substrate, of the source preset region, and the vertical projection, on the substrate, of the second blocking subsection overlaps with the vertical projection, on the substrate, of each one of the gate preset region and the drain preset region; and
there are ions implanted in the blocking layer, an ion implant concentration in the second blocking subsection is greater than or equal to an ion implant concentration of the first blocking subsection.

2. The epitaxial structure according to claim 1, wherein a resistivity of the second buffer subsection is greater than or equal to a resistivity of the first buffer subsection.

3. The epitaxial structure according to claim 1, wherein the ion implant concentration C1 in the first buffer subsection satisfies C1=0, and the resistivity $\rho_1$ of the first buffer subsection satisfies 0.1 $\Omega \cdot cm \leq \rho 1 \leq 100$ $\Omega \cdot cm$; and
the ion implant concentration C2 in the second buffer subsection satisfies $1 \times 10^{17}$ cm$-3 \leq C2 \leq 5 \times 10^{18}$ cm$-3$, and the resistivity $\rho_2$ of the second buffer subsection satisfies 105 $\Omega \cdot cm \leq \rho 2 \leq 10^{10}$ $\Omega \cdot cm$.

4. The epitaxial structure according to claim 1, wherein the ion implant concentration C1 in the first buffer subsection satisfies $0 < C1 \leq 5 \times 10^{18}$ cm$-3$, and the resistivity $\rho 1$ of the first buffer subsection satisfies 0.1 $\Omega \cdot cm \leq \rho 1 \leq 10^{10}$ $\Omega \cdot cm$; and
the ion implant concentration C2 in the second buffer subsection satisfies $1 \times 10^{17}$ cm$-3 \leq C2 \leq 5 \times 10^{18}$ cm$-3$, and the resistivity $\rho 2$ of the second buffer subsection satisfies 105 $\Omega \cdot cm \leq \rho 2 \leq 10^{10}$ $\Omega \cdot cm$.

5. The epitaxial structure according to claim 1, wherein the ion implant concentration in the second blocking subsection is less than the ion implant concentration in the second buffer subsection.

6. The epitaxial structure according to claim 1, wherein a resistivity of the second blocking subsection is greater than or equal to a resistivity of the first blocking subsection.

7. The epitaxial structure according to claim 1, wherein
the ion implant concentration C3 in the first blocking subsection satisfies C3=0, and the resistivity ρ3 of the first blocking subsection satisfies 0.1 Ω·cm≤ρ3≤100 Ω·cm; and
the ion implant concentration C4 in the second blocking subsection satisfies 1×1015 cm−3≤C4≤5×1016 cm−3, and the resistivity ρ4 of the second blocking subsection satisfies 105 Ω·cm≤ρ4≤1010 Ω·cm.

8. The epitaxial structure according to claim 1, wherein
the ion implant concentration C3 in the first blocking subsection satisfies 0<C3≤5×1016 cm−3, and the resistivity ρ3 of the first blocking subsection satisfies 0.1 Ω·cm≤ρ3≤1010 Ω·cm; and
the ion implant concentration C4 in the second blocking subsection satisfies 1×1015 cm−3≤C4≤5×1016 cm−3, and the resistivity ρ4 of the second blocking subsection satisfies 105 Ω·cm≤ρ4≤1010 Ω·cm.

9. The epitaxial structure according to claim 1, wherein
the semiconductor layer further comprises a nucleation layer located between the substrate and the buffer layer;
the nucleation layer comprises a first nucleation subsection and a second nucleation subsection which are connected to each other and arranged along a direction from the source preset region to the drain preset region, the first nucleation subsection is located between the first buffer subsection and the substrate, and the second nucleation subsection is located between the second buffer subsection and the substrate; and
there are ions implanted in the nucleation layer, and an ion implant concentration in the second nucleation subsection is greater than or equal to an ion implant concentration in the first nucleation subsection.

10. The epitaxial structure according to claim 9, wherein a resistivity of the second nucleation subsection is greater than or equal to a resistivity of the first nucleation subsection.

11. The epitaxial structure according to claim 9, wherein
the ion implant concentration C5 in the first nucleation subsection satisfies C5-0, and the resistivity ρ5 of the first nucleation subsection satisfies 0.1 Ω·cm≤ρ5≤100 Ω·cm; and
an ion concentration C6 in the second nucleation subsection satisfies 1×1017 cm−3≤C6≤5×1018 cm−3, and an resistivity ρ6 of the second nucleation subsection satisfies 105 Ω·cm≤ρ6≤1010 Ω·cm.

12. The epitaxial structure according to claim 9, wherein
the ion implant concentration C5 in the first nucleation subsection satisfies 0<C535×1018 cm−3, and the resistivity ρ5 of the first nucleation subsection satisfies 0.1 Ω·cm≤ρ5≤1010 Ω·cm; and
the ion concentration C6 in the second nucleation subsection satisfies 1×1017 cm−3≤C6≤5×1018 cm−3, and the resistivity ρ6 of the second nucleation subsection satisfies 105 Ω·cm≤ρ6≤1010 Ω·cm.

13. The epitaxial structure according to claim 1, wherein the ions comprise at least one of boron ions, arsenic ions, helium ions, beryllium ions, magnesium ions, argon ions, aluminum ions, phosphorus ions, nitrogen ions, oxygen ions, carbon ions and iron ions.

14. A semiconductor device, comprising:
the epitaxial structure according to claim 1; and
a gate, a source and a drain located on one side of the semiconductor layer away from the substrate;
wherein the gate is located in the gate preset region, and the source is located in the source preset region, and the drain is located in the drain preset region.

15. A manufacturing method of an epitaxial structure of a semiconductor device, for manufacturing the epitaxial structure according to claim 1, comprising:
providing a substrate; and
forming a semiconductor layer at one side of the substrate;
wherein the semiconductor layer at least comprises a buffer layer and a blocking layer formed on one side of the substrate, the buffer layer comprises a first buffer subsection and a second buffer subsection which are connected to each other and arranged along a direction from a source preset region to a drain preset region,
a vertical projection, on the substrate, of the first buffer subsection overlaps with a vertical projection, on the substrate, of the source preset region, and a vertical projection, on the substrate, of the second buffer subsection overlaps with a vertical projection, on the substrate, of a gate preset region and the drain preset region;
there are ions implanted in the buffer layer, the ion implant concentration of the second buffer subsection is greater than or equal to an ion implant concentration in the first buffer subsection,
the gate preset region is located between the source preset region and the drain preset region;
a blocking layer comprises a first blocking subsection and a second blocking subsection which are connected to each other and arranged along a direction from the source preset region to the drain preset region, the first blocking subsection is formed on one side of the first buffer subsection away from the substrate, and the second blocking subsection is formed on one side of the second buffer subsection away from the substrate, and
the forming a semiconductor layer at one side of the substrate comprises:
forming the buffer layer and the blocking layer at one side of the substrate sequentially; and
implanting the ions, from one side of the blocking layer away from the substrate, into each one of the blocking layer and the buffer layer, wherein an ion implant concentration in the second blocking subsection is greater than or equal to an ion implant concentration in the first blocking subsection, and an ion implant concentration in the second blocking subsection is less than an ion implant concentration in the second buffer subsection.

16. The manufacturing method according to claim 15, wherein
a resistivity of the second buffer subsection is greater than or equal to a resistivity of the first buffer subsection.

17. The manufacturing method according to claim 15, wherein
the ion implant concentration in the second blocking subsection is less than the ion implant concentration in the second buffer subsection.

18. The manufacturing method according to claim 15, wherein
the semiconductor layer further comprises a nucleation layer, the nucleation layer comprises a first nucleation subsection and a second nucleation subsection which are connected to each other and arranged along a direction from the source preset region to the drain preset region, the first nucleation subsection is formed between the first buffer subsection and the substrate, and the second nucleation subsection is formed between the second buffer subsection and the substrate, and the forming a semiconductor layer at one side of the substrate comprises:

forming the nucleation layer and the buffer layer at one side of the substrate sequentially; and implanting ions, from one side of the buffer layer away from the substrate, into the buffer layer and the nucleation layer, wherein an ion implant concentration in the second nucleation subsection is greater than or equal to an ion implant concentration in the first nucleation subsection.

* * * * *